United States Patent
Harvey

(10) Patent No.: US 10,024,934 B2
(45) Date of Patent: Jul. 17, 2018

(54) BIRDCAGE BODY COIL FOR PARALLEL TRANSMIT MRI

(71) Applicant: KONINKLIJKE PHILIPS N.V., Eindhoven (NL)

(72) Inventor: Paul Royston Harvey, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 623 days.

(21) Appl. No.: 14/432,805

(22) PCT Filed: Sep. 11, 2013

(86) PCT No.: PCT/EP2013/068795
§ 371 (c)(1),
(2) Date: Apr. 1, 2015

(87) PCT Pub. No.: WO2014/053289
PCT Pub. Date: Apr. 10, 2014

(65) Prior Publication Data
US 2015/0253393 A1   Sep. 10, 2015

Related U.S. Application Data

(60) Provisional application No. 61/708,736, filed on Oct. 2, 2012.

(30) Foreign Application Priority Data

Oct. 2, 2012 (EP) .................................. 12186976

(51) Int. Cl.
*G01R 33/34* (2006.01)
*G01R 33/3415* (2006.01)
(Continued)

(52) U.S. Cl.
CPC ... *G01R 33/34076* (2013.01); *G01R 33/3415* (2013.01); *G01R 33/3628* (2013.01); *G01R 33/561* (2013.01); *G01R 33/5612* (2013.01)

(58) Field of Classification Search
CPC ........ G01R 33/34076; G01R 33/34046; G01R 33/3415; G01R 33/3628; G01R 33/561; G01R 33/5612
See application file for complete search history.

(56) References Cited

U.S. PATENT DOCUMENTS 6,043,658 A    3/2000 Leussler
6,344,745 B1 *  2/2002 Reisker ............ G01R 33/34046
                                                                324/318
(Continued)

FOREIGN PATENT DOCUMENTS

CN     101819263 A    9/2010
EP       1363135 A2   11/2003
WO    200208778 A1    1/2002

OTHER PUBLICATIONS

Cheng, Y.C.N. "A Degeneracy Study in the Circulant and Bordered-Circulant Approach to Birdcage and Planar Coils" Magma Magnetic Resonance Materials in Physics, Biology and Medicine, vol. 16, No. 2, Jul. 2003.

(Continued)

Primary Examiner — Rishi Patel

(57) ABSTRACT

A birdcage resonator (109) for MR imaging, surrounds an examination volume and includes a plurality of rungs (1-16) arranged in parallel to a longitudinal axis of the examination volume. Each rung (1-16) includes a rung capacitance ($C_{rung}$). Two end rings are arranged at the opposite ends of the rungs (1-16), each end ring includes a plurality of ring capacitances ($C_{ring}$). Each ring capacitance ($C_{ring}$) interconnects a pair of adjacent rungs (1-16). Each pair of adjacent rungs and the interconnecting ring capacitances ($C_{ring}$) form (Continued)

a mesh of the birdcage resonator. The ring capacitances ($C_{ring}$) and the rung capacitances ($C_{rung}$) are proportioned so that: —the birdcage resonator (109) has a plurality of resonant modes that are tuned to the same resonance frequency, and the meshes of the birdcage resonator (109) are electromagnetically coupled. An MR device (101) includes the birdcage resonator.

16 Claims, 5 Drawing Sheets

(51) Int. Cl.
  *G01R 33/561* (2006.01)
  *G01R 33/36* (2006.01)

(56) References Cited

U.S. PATENT DOCUMENTS

| | | | |
|---|---|---|---|
| 6,825,660 | B2 | 11/2004 | Boskamp |
| 6,943,551 | B2 | 9/2005 | Eberler |
| 7,501,828 | B1 | 3/2009 | Wong |
| 7,990,144 | B2 | 8/2011 | Wang |
| 2005/0242816 | A1* | 11/2005 | Kurpad ............ G01R 33/34046 324/322 |
| 2006/0033497 | A1 | 2/2006 | Chmielewski |
| 2010/0219834 | A1 | 9/2010 | Luedeke |

OTHER PUBLICATIONS

Eagan, T. et al "Group Theoretical Approach to RF Coil Design", Proc. Intl. Society Magnetic Resonance in Medicine, vol. 11, Jan. 2003, p. 2384.

Nistler, J. et al "A Degenerate Bandpass Birdcage as Antenna for a 3T Whole body Transmit Array" Proc. Intl. Society Magnetic Resonance in Medicine, Jan. 2006, p. 2566.

Alagappan, V. et al "Degenerate Mode Band-Pass Birdcage Coil for Accelerated Parallel Excitation" Magnetic Resonance in Medicine, vol. 57, May 2007, pp. 1148-1158.

Leussler, C. et al "The Bandpass Birdcage Resonator Modified as a Coil Array for Simultaneous MR Acquisition", Proceddings of the Society of Magnetic Resonance in Medicine, vol. 1, Apr. 1997, pp. 176.

Eagan, T. et al "A Group Theory Approach to RF Coil Design", Concepts in Magnetic Resonance Part B: Magnetic Resonance Engineering, vol. 25B, No. 1, Jan. 2005, pp. 42-52.

Kurpad, K. et al "Volume RF Transmit Coil with Integrated Power MOSFETs", International Society for Magnetic Resonance in Medicine, vol. 10, Jan. 2002.

Ibrahim, T.S. et al "Application of Finite Difference Time Domain Method for the Design of Birdcage RF Head Oils using Multi-Port Excitations", Magnetic Resonance Imaging, vol. 18, Jan. 2000, pp. 733-742.

Wiesinger, F. et al "Evaluation of Parallel Transmit RF-Shimming Performance for 3 Tesla Whole-Body Imaging", International Society for Magnetic Resonance in Medicine, No. 15, Jan. 2007, pp. 3352.

Taracila, Victor et al "Image Uniformity Improvement for Birdcage like Volume Coils at 400 MHz using Multichannel Excitations", Concepts in Magnetic Resonance Part B: Magnetic Resonance Engineering, vol. 29B, No. 3, Jan. 2006, pp. 153-160.

Wang, C. et al "Optimization of a Multi-Channel Transmit, Quadrature Receive Birdcage Coil", Proc. International Society for Magnetic Resonance in Medicine, vol. 14, Jan. 2006, p. 3539.

\* cited by examiner a) Relative RF current magnitude b) Phase (°)

BIRDCAGE BODY COIL FOR PARALLEL TRANSMIT MRI

CROSS-REFERENCE TO PRIOR APPLICATIONS

This application is the U.S. National Phase application under 35 U.S.C. § 371 of International Application No. PCT/EP2013/068795, filed on Sep. 11, 2013, which claims the benefit of U.S. Provisional Patent Application No. 61/708,736 and European Patent Application No. 12186976.2, both filed on Oct. 2, 2012. These applications are hereby incorporated by reference herein.

TECHNICAL FIELD

The invention relates to the field of magnetic resonance (MR) imaging. It concerns a birdcage resonator for MR imaging and an MR device including a birdcage resonator.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the coordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, resonance frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field of the RF pulse extends perpendicular to the z-axis, so that the magnetization performs a precession about the z-axis. This motion of the magnetization describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°). The RF pulse is radiated toward the body of the patient via a RF coil arrangement of the MR device. The RF coil arrangement typically surrounds the examination volume in which the body of the patient is placed.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of the aforementioned RF coil arrangement of the MR device. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the RF coil arrangement then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

The band pass birdcage resonator (also referred to as birdcage coil) is a well-known concept for the RF coil arrangement in MR imaging. Such a birdcage resonator comprises a plurality of rungs arranged in parallel to a longitudinal axis of the examination volume surrounded by the birdcage resonator. Each rung comprises a rung capacitance $C_{rung}$. Two end rings are arranged at the opposite ends of the rungs, wherein each end ring comprises a plurality of ring capacitances $C_{ring}$. Each ring capacitance $C_{ring}$ interconnects a pair of adjacent rungs. Such a conventional design of a birdcage resonator as commonly used in MR imaging is shown in FIG. 1.

The resonant frequency of the multiple resonant modes of the band pass birdcage coil are determined by the various geometric properties of the coil (which influence its inductance properties) and the values of capacitances, $C_{ring}$ and $C_{rung}$, that are placed in the end ring segments and the rungs respectively. For any given geometry, while keeping the ratio of $C_{ring}/C_{rung}$ fixed, it is possible to tune the coil structure to place a desired resonant mode at the required Larmor frequency. This is done by manipulating the values of $C_{ring}$ and $C_{rung}$ in a coupled manner. It is observed that the ratio of $C_{ring}/C_{rung}$ determines the relative frequency separation of modes while the absolute values of $C_{ring}$ and $C_{rung}$ determine the absolute frequency. By selecting a ratio of $C_{ring}/C_{rung}$ it is possible to manipulate the multiple resonant modes of the coil as required. The ISMRM 1997 p. 176 abstract '*The bandpass birdcage resonantor modified as a coilray for simultaneous MR acquisition*' mentions that the ratio of rung-capacitors to ring-capacitors is a critical parameter to determine the low-pass or high-pass characteristics of a bandpass birdcage coil. In the birdcage coil known from ISMRM 1997 p. 176 abstract adjacent meshes are isolated.

While in FIG. 1 the capacitances are shown as discrete capacitors, the values $C_{ring}$ and $C_{rung}$ may be realized using multiple capacitors in series or parallel.

In a typical MR imaging system, a band pass birdcage resonator is employed, wherein the design of the birdcage resonator uses capacitance values $C_{ring}$ and $C_{rung}$ which realize the common so-called two-port birdcage tuning in which only a single uniform resonant mode is tuned to the Larmor frequency. In this case, the coil structure can be driven in quadrature by supplying RF power via two RF drive ports located physically 90° apart. In the case of quadrature excitation, the magnitude of the RF current is equal in each rung, while the phase of the RF current increments from rung to rung in equal increments from 0° to 360°.

It is generally desirable to have a relatively uniform homogeneity of the generated RF field ($B_1$ field) for excitation of magnetic resonance throughout a cross section of the imaged portion of the patient's body. However, as the MR frequency increases with increasing strength of the main magnetic ($B_0$ field), this becomes more difficult due to conductive losses and wavelength effects within the body of the patient. On examining the performance of a conventional birdcage resonator with respect to excitation uniformity it is observed that at high frequencies (>128 MHz) dielectric based standing wave mechanisms severely affect the $B_1$ field uniformity.

Multi-channel transmit MR imaging has been accepted as a standard method of operating volume RF coils to achieve a relatively uniform $B_1$ field. In the basic example of multi-transmit, the volume RF coil arrangement is split into many independent resonator elements. The RF signal for generating the $B_1$ field is then supplied to the RF coil arrangement via RF drive ports being connected to the individual resonator elements. The RF power and the RF phase applied to the different RF drive ports can be controlled individually in order to optimize the uniformity of the RF field (so-called RF shimming).

One way of realizing a multi-transmit RF coil arrangement is known from U.S. Pat. No. 6,043,658. In this approach the $C_{ring}$ and $C_{rung}$ capacitance values of a birdcage resonator are selected such that all resonant modes are tuned to a single frequency. The effect of this is that the individual meshes of the birdcage resonator behave as electromagnetically decoupled individual elements. Each mesh can then be treated as an independent resonator element, which is supplied with an individually controllable RF signal in accordance with the multi-transmit scheme to achieve a uniform $B_1$.

However, the ability to realize the degenerate tuning of a birdcage resonator (as known from U.S. Pat. No. 6,043,658) depends on the dimensions of the coil and the number of rungs. It has been observed that in the case of a large bore design with a closely fitting RF screen it is difficult, even impossible, to achieve the conventional degenerate tuning in practice.

BRIEF SUMMARY

From the foregoing it is readily appreciated that there is a need for an improved MR imaging technique. It is consequently an object of the invention to enable power-efficient generation of a uniform $B_1$ field at high resonance frequencies (>128 MHz). In accordance with the invention, a birdcage resonator for MR imaging is disclosed. The birdcage resonator surrounds an examination volume and comprises:
- a plurality of rungs arranged in parallel to a longitudinal axis of the examination volume, each rung comprising a rung capacitance $C_{rung}$;
- two end rings arranged at the opposite ends of the rungs, each end ring comprising a plurality of ring capacitances $C_{ring}$, wherein each ring capacitance $C_{ring}$ interconnects a pair of adjacent rungs, each pair of adjacent rungs and interconnecting ring capacitances $C_{ring}$ forming a mesh of the birdcage resonator. According to the invention, the ring capacitances $C_{ring}$ and the rung capacitances $C_{rung}$ are proportioned so that:
the birdcage resonator has a plurality of resonant modes that are tuned to the same resonance frequency, and the meshes of the birdcage resonator are electromagnetically coupled.

In an embodiment of the invention, the birdcage resonator comprises N rungs containing both ring ($C_{ring}$) and rung ($C_{rung}$) capacitances, wherein the ratio of ring to rung capacitance values is chosen to realize N resonant modes, each tuned to the same resonance frequency, whereby, for each resonant mode, individual meshes of the birdcage resonator are not substantially electrically decoupled from each other. The fundamental difference between the invention and the classical degenerate birdcage resonator design (as known from U.S. Pat. No. 6,043,658) is that the tuning scheme is such that, while multiple independent field distributions of the different resonant modes are achieved, these field distributions are not equal in spatial distribution to those of a classical degenerate tuning, and the meshes of the birdcage resonator are not (and need not be) substantially electromagnetically decoupled from each other. The invention is based on the insight that a ratio of $C_{ring}/C_{rung}$ exists in which a set of resonant modes is generated with as many degrees of freedom as rungs in the resonator. The $B_1$ field distributions generated by the individual modes do exhibit enough uniqueness such that they can be linearly combined to realize a power-efficient uniform circularly polarized $B_1$ field distribution.

In a preferred embodiment of the invention, the arrangement of the rungs forms a generally cylindrical shape. This corresponds to the conventional design of birdcage resonators, in which the examination volume (the bore of the respective MR device) has a substantially circular cross-section of constant diameter.

In a further preferred embodiment of the invention, the birdcage resonator comprises a plurality of RF drive ports, wherein each rung is connected to a different RF drive port. A resonant RF signal supplied via only one of the RF drive ports generates an RF electrical current in each of the rungs resulting from the specific tuning of the birdcage resonator according to the invention.

In a specific embodiment of the invention, with a birdcage resonator having 16 rungs, the values of $C_{ring}$ and $C_{rung}$ are chosen to realize a resonant tuning which, when an RF signal is supplied to any single RF drive port, generates the rung current magnitude and phase distribution according to the following table (approximate values).

| Rung no. | Relative RF current magnitude | RF current phase (°) |
| --- | --- | --- |
| 1 | 71% | 9 |
| 2 | 56% | 14 |
| 3 | 34% | 26 |
| 4 | 16% | 80 |
| 5 | 29% | 152 |
| 6 | 50% | 172 |
| 7 | 68% | 180 |
| 8 | 100% | 226 |
| 9 | 68% | 180 |
| 10 | 50% | 172 |
| 11 | 29% | 154 |
| 12 | 15% | 79 |
| 13 | 34% | 25 |
| 14 | 56% | 13 |
| 15 | 70% | 9 |
| 16 | 77% | 8 |

In the case illustrated in the above table, the RF signal is supplied only via the RF drive port connected to rung no. 8.

The spatial distribution of the current magnitude and the current phase within the birdcage resonator is in a fixed spatial relation to the position of the rung to which an RF signal is supplied via the respective RF drive port. Selection of a different RF drive port will result simply in a corresponding rotation of the RF current magnitude and phase distribution around the axis of the cylindrical examination volume. Excitation at multiple RF drive ports results in linear superposition of the shifted RF current magnitude and phase distributions. The invention does not only relate to a birdcage resonator but also to a MR device. According to the invention, the MR device includes:

- a main magnet for generating a uniform, steady magnetic field within an examination volume along a main field axis,
- a number of gradient coils for generating switched magnetic field gradients in different spatial directions within the examination volume,
- at least one RF coil arrangement for generating RF pulses within the examination volume and/or for receiving MR signals from a body of a patient positioned in the examination volume, which RF coil arrangement includes a birdcage resonator of the type set forth,
- a control unit for controlling the temporal succession of RF pulses and switched magnetic field gradients, and
- a reconstruction unit.

In a preferred embodiment, the MR device further comprises a transmit unit for transmitting RF signals to the RF coil arrangement, wherein the transmit unit has a plurality of transmit channels, each transmit channel being connected to one RF drive port of the birdcage resonator. Therein, the number of transmit channels is equal to the number of rungs of the birdcage resonator. Driving the birdcage resonator of the invention via the independent transmit channels allows for significant improvement of the $B_1$ field within the body of the examined patient. Preferably, each transmit channel comprises an RF power amplifier as source of an RF signal supplied via the respective transmit channel. RF shimming is enabled by individually adjusting the power and/or phase of the RF signal transmitted via each transmit channel. A maximum uniformity of the $B_1$ field and maximum power-efficiency are achieved when all RF drive ports are supplied with RF signals with a quadrature phase distribution.

In an alternative embodiment, each transmit channel is connected to a quadrature pair of RF drive ports of the birdcage resonator via a quadrature hybrid. The number of transmit channels is then equal to half the number of rungs of the birdcage resonator. The rungs associated with each of the quadrature pairs of RF drive ports have an angular distance of 90° with respect to the longitudinal axis of the birdcage coil. An optimum $B_1$ uniformity is achieved with this embodiment, wherein only half the number of RF power amplifiers is required.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
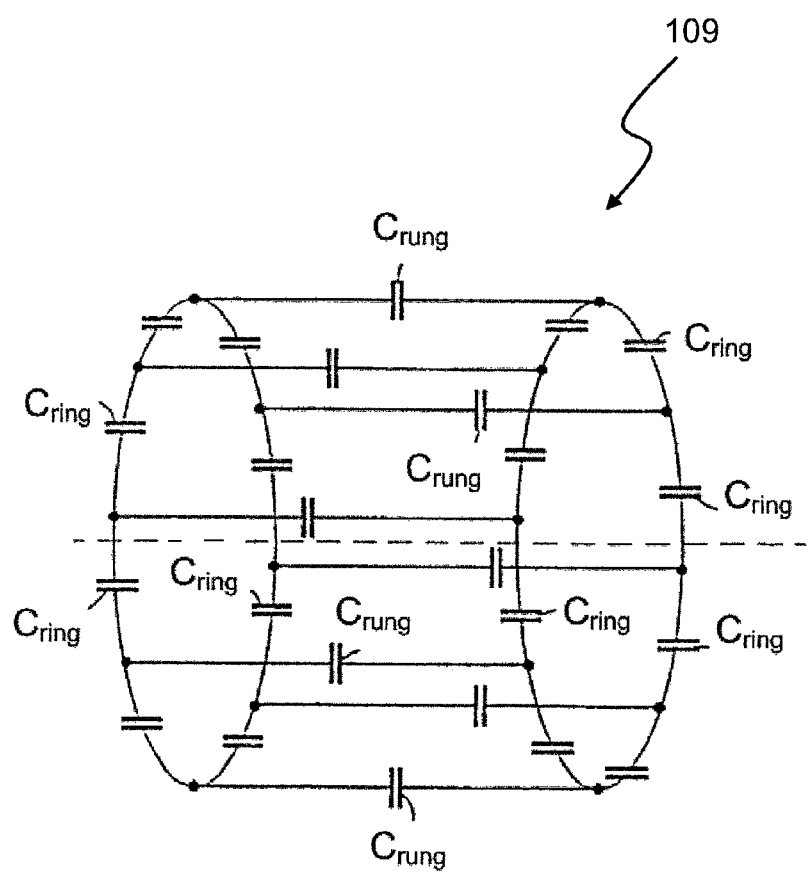
FIG. 1 shows a birdcage resonator of cylindrical shape.

FIG. 1 shows the conventional design of a birdcage resonator 109 as it is commonly used in MR imaging. The birdcage resonator 109 comprises a plurality of rungs arranged along the circumference of a cylindrical examination volume. Each rung comprises a rung capacitance $C_{rung}$. Two end rings are arranged at the opposite ends of the rungs, wherein each end ring comprises a plurality of ring capacitances $C_{ring}$. Each ring capacitance $C_{ring}$ interconnects a pair of adjacent rungs. Each pair of adjacent rungs and interconnecting ring capacitances $C_{ring}$ forms a mesh of the birdcage resonator.

In a conventional MR imaging system, the birdcage resonator uses capacitance values $C_{ring}$ and $C_{rung}$ which realize the common so-called two-port birdcage tuning, in which only a single uniform resonant mode is tuned to the Larmor frequency.

According to the invention, in contrast, the ratio of ring to rung capacitance values is chosen to realize N resonant modes, each tuned to the same resonance frequency. For each resonant mode, individual meshes of the birdcage resonator are not substantially electrically decoupled from each other. A ratio of $C_{ring}/C_{rung}$ is selected in which a set of resonant modes is generated with as many degrees of freedom as rungs in the resonator. The $B_1$ field distributions generated by the individual modes can be linearly combined to realize a power-efficient uniform circularly polarized $B_1$ field distribution.

In a conventionally tuned two-port birdcage resonator of fixed physical dimensions the $C_{ring}/C_{rung}$ ratio may be 2.833, for example, realized with a total ring capacitance of 81.1 pF and a rung capacitance of 28.8 pF. To convert the same structure to operate according to the invention, the ratio of $C_{ring}/C_{rung}$ would have to be adjusted to 0.891. The ratio of 0.891, while achieving resonance at the same Larmor frequency as in the conventional tuning, may be achieved using a ring capacitance $C_{ring}$ of 58.4 pF and a rung capacitance $C_{rung}$ of 65.6 pF. For different physical resonator dimensions, different ratios and absolute values will be required. This indicates that there is a clear and predictable difference in capacitance values required to convert a conventionally tuned bandpass coil to a birdcage coil tuned according to the invention.

Figure 2:
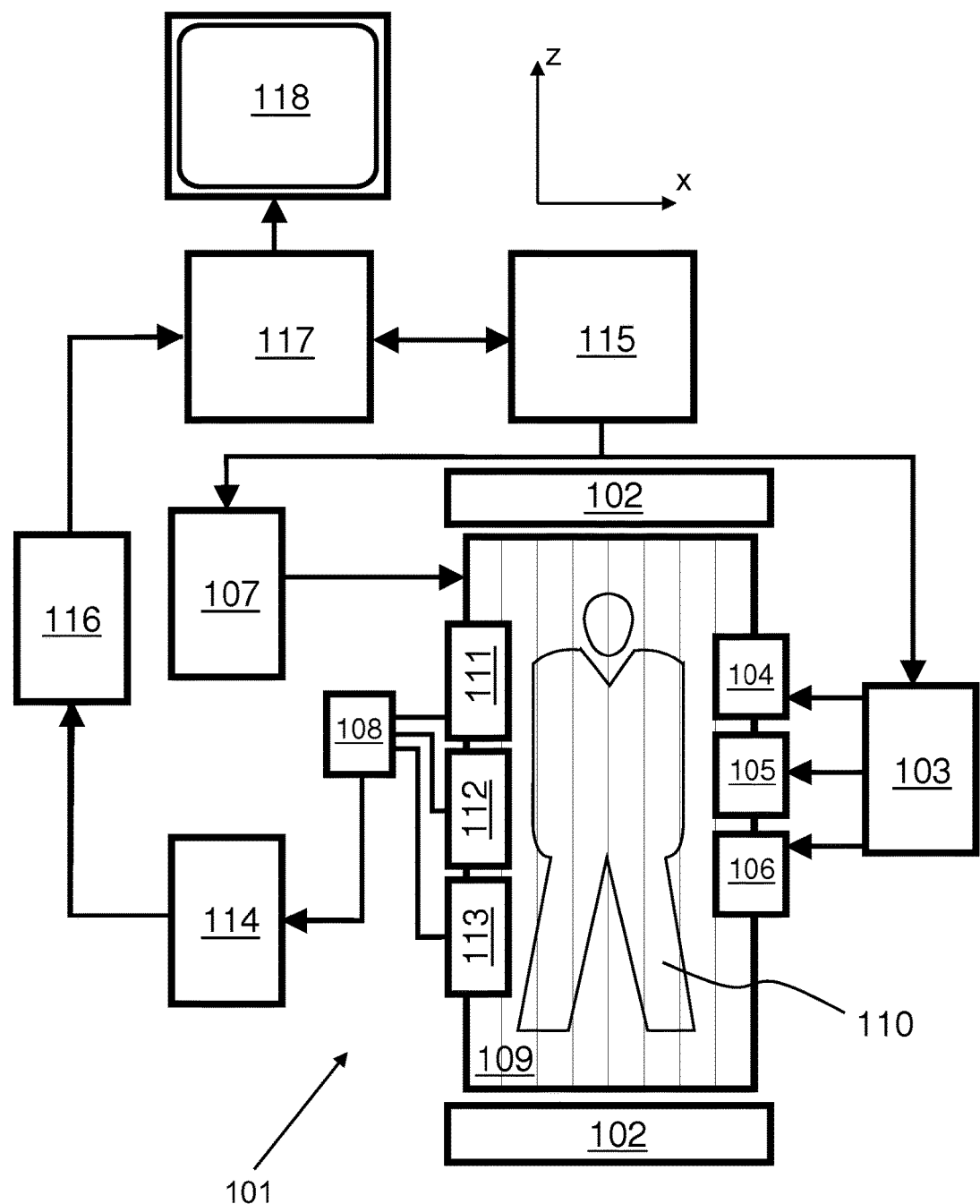
FIG. 2 shows an MR device according to the invention.

With reference to FIG. 2, an MR device 101 is shown. The device comprises superconducting or resistive main magnet coils 102 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 103 applies current pulses to selected ones of whole-body gradient coils 104, 105 and 106 along x, y and z-axes of the examination volume. A digital multi-channel RF frequency transmitter 107 transmits RF pulses or pulse packets via the RF drive ports of the whole-body volume birdcage resonator 109 to transmit RF pulses into the examination volume.

A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 110 positioned in the examination volume. The MR signals are also picked up by the whole-body volume RF coil 109.

For generation of MR images of limited regions of the body 110 by means of parallel imaging, a set of local array RF coils 111, 112, 113 are placed contiguous to the region selected for imaging. The array coils 111, 112, 113 can be used to receive MR signals induced by body-coil RF transmissions.

The resultant MR signals are picked up in the depicted embodiment by the array RF coils 111, 112, 113 and demodulated by a receiver 114 preferably including a preamplifier (not shown). The receiver 114 is connected to the RF coils 111, 112 and 113 via switch 108.

A host computer 115 controls the gradient pulse amplifier 103 and the transmitter 107 to generate any of a plurality of MR imaging sequences, such as echo planar imaging (EPI), echo volume imaging, gradient and spin echo imaging, fast spin echo imaging, and the like. For the selected sequence, the receiver 114 receives a single or a plurality of MR data lines in rapid succession following each RF excitation pulse. A data acquisition system 116 performs analog-to-digital conversion of the received signals and converts each MR data line to a digital format suitable for further processing. In modern MR devices the data acquisition system 116 is a separate computer which is specialized in acquisition of raw image data.

Ultimately, the digital raw image data is reconstructed into an image representation by a reconstruction processor 117 which applies a Fourier transform and other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 118 which provides a man-readable display of the resultant MR image.

Figure 3:
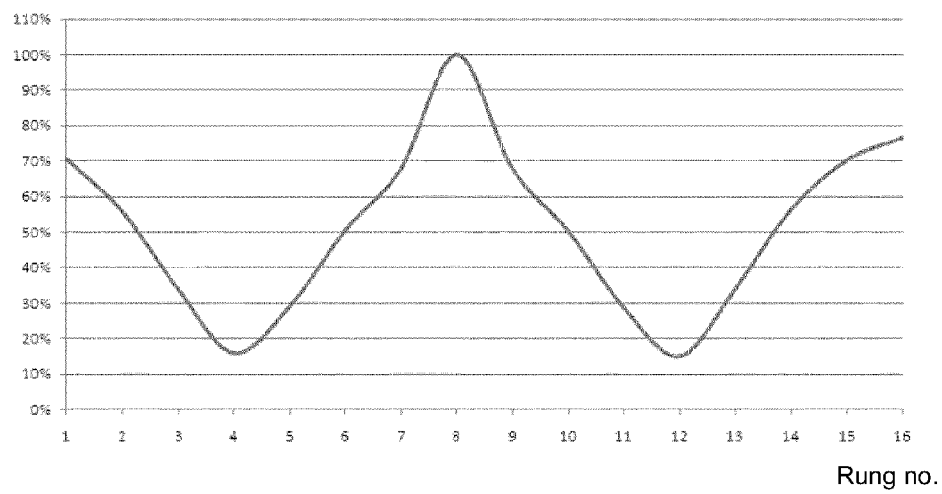
FIG. 3 shows diagrams illustrating the RF current distribution in the birdcage resonator of the invention.
Figure 3:
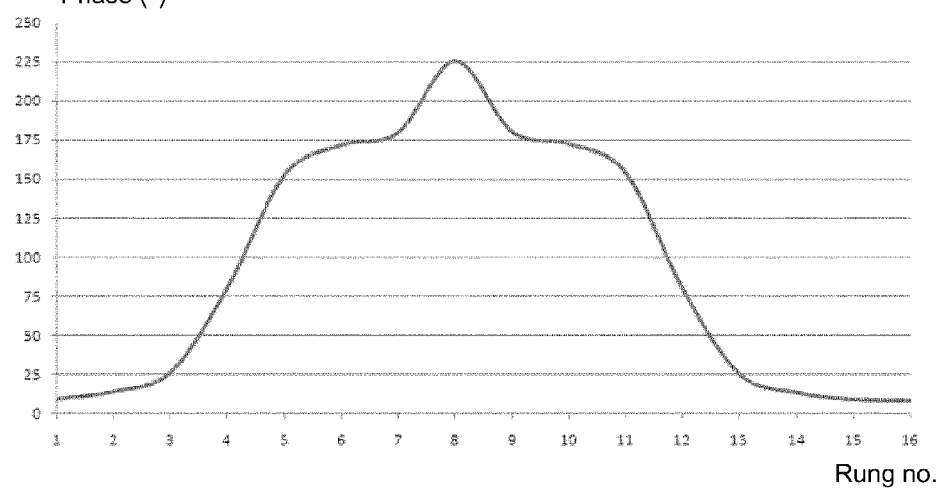

The birdcage resonator 109 comprises a plurality of RF drive ports, wherein each rung is connected to a different RF drive port. The values of $C_{ring}$ and $C_{rung}$ of the birdcage resonator 109 are chosen to realize a resonant tuning, which, when resonantly driven at any single RF drive port, generates an RF rung current magnitude and phase distribution according to FIGS. 3a and 3b. FIG. 3 relates to an embodiment, in which the birdcage resonator has a total number of 16 rungs. In FIG. 3a the relative magnitude of the RF current is plotted as a function of the rung number. In FIG. 3b the phase of the RF current is plotted as a function of the rung number. In the depicted case, an RF signal is supplied to the RF drive port connected to rung number 8.

Figure 4:
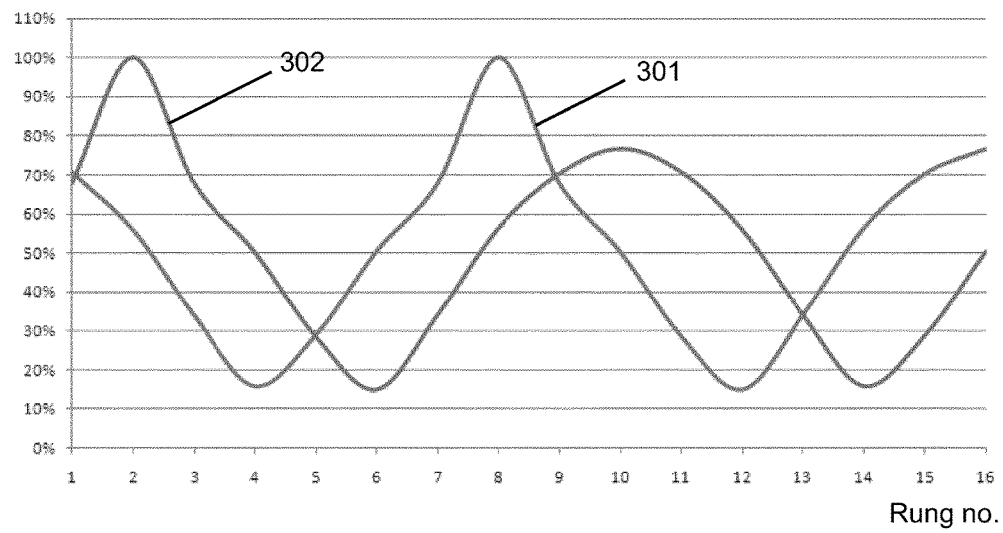
FIG. 4 shows further diagrams illustrating the RF current distribution in the birdcage resonator of the invention with RF signals supplied via different RF drive ports.
Figure 4:
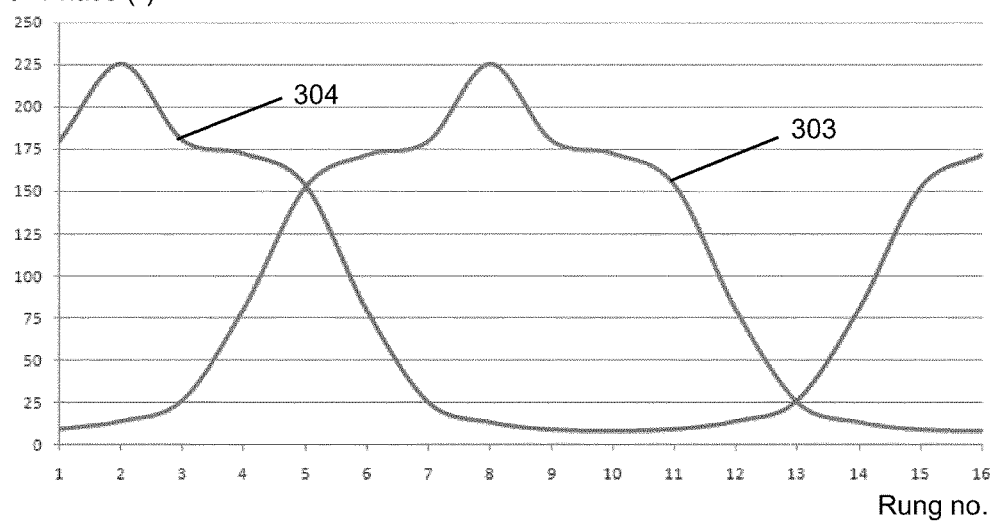

In the birdcage resonator 109 tuned according to the invention, the mapping of RF current magnitudes and phases to specific rungs 1-16 has a fixed spatial relationship to the RF drive port. Selection of a different RF drive port will result in a simple rotation of the RF current magnitude and phase distribution around the axis of the birdcage resonator 109. Excitation at multiple RF drive ports results in linear superposition of the shifted RF current magnitude and phase distributions. In FIGS. 4a and 4b the relative magnitude of the RF current and the phase of the RF current is plotted as a function of the rung number. Curves 301 and 303 refer to the case, in which an RF signal is supplied via the RF drive port connected to rung number 8, while curves 302 and 304 refer to the case, in which the RF signal is supplied via the RF drive port connected to rung number 2. As becomes obvious from the diagrams, the shape of the RF current and phase distributions remains the same, while the curves are shifted along the horizontal axes of the diagrams.

As mentioned above, the birdcage resonator 109 of the invention is tuned in such a manner that N spatially independent excitation modes exist, wherein N is equal to the number of rungs. A particular property of these resonant modes is that they each exhibit a behavior similar to a linear driving scheme of a conventional birdcage resonator. Driving at a single RF drive port generates a distributed RF current and phase distribution across all rungs, which yields a linear-like $B_1$ field distribution within the examination volume. Driving at an adjacent RF drive port, with suitable phase shift, yields an identical $B_1$ field distribution, which is spatially rotated corresponding to the displacement of the adjacent RF drive port. The combined $B_1$ fields from exciting two adjacent RF drive ports are superposed in a constructive and power-efficient manner. Quadrature excitation via RF drive ports connected to two rungs located 90° apart with respect to the axis of the birdcage resonator 109 yields an essentially quadrature field, but with about $\frac{1}{8}^{th}$ the power-efficiency of a conventionally tuned birdcage resonator. However, driving the birdcage resonator 109 of the invention via all 16 RF drive ports with a quadrature phase distribution realizes a fully uniform quadrature field at a power-efficiency corresponding to a conventionally tuned birdcage resonator. The advantage of the approach of the invention is that the RF power can be distributed among all 16 RF drive ports as opposed to only 2 RF drive ports of the conventionally tuned birdcage resonator. In addition, the 16 degrees of freedom obtained by the invention enable RF shimming.

In a specific embodiment of the invention, in which the birdcage resonator 109 is driven with a quadrature phase distribution across all 16 RF drive ports, the total required incident power is 9.1 kW. This value is very similar to the power-efficiency realized with a conventionally tuned birdcage resonator. Hence, the RF power can be fully distributed across 16 RF power amplifiers with a power capability of significantly less than 1 kW each. Moreover, as mentioned above, this topology allows for RF shimming, which can be achieved with very little penalty in total RF power (9.2 kW).

Figure 5:
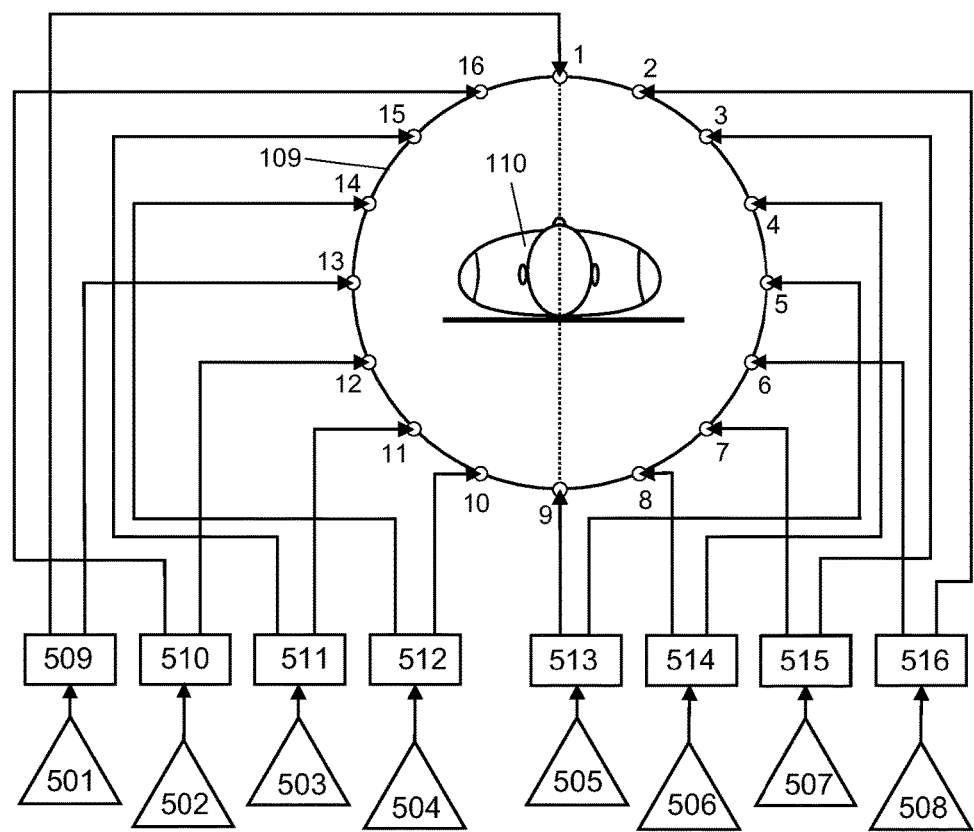
FIG. 5 shows a RF driving scheme of the birdcage resonator according to the invention.

In the afore-described embodiment, the tuning of the birdcage resonator 109 enables to connect an individual RF power amplifier to each rung. In the case of a 16-rung birdcage resonator this would require 16 RF power amplifiers. However, with this kind of tuning, RF drive ports connected to rungs that have an angular distance of 90° degrees with respect to the axis of the birdcage resonator 109 behave like quadrature pairs. Connecting the respective RF drive ports in a quadrature driving scheme results in a uniform quadrature $B_1$ field. From this property it is appreciated that pairs of RF drive ports (rungs) that are 90° apart can be driven in quadrature using a single RF power amplifier connected to a standard quadrature hybrid. FIG. 5 shows how it is possible to connect 8 RF power amplifiers 501-508 to a 16-rung birdcage resonator 109 in this manner by combining suitable pairs of RF drive ports into a series of quadrature hybrids 509-516. This approach enables to reduce the number of RF amplifiers. An additional benefit is that the behavior of the quadrature hybrids 509-516 is such that reflected RF power, due to port missmatch, is prevented from entering the RF power amplifiers 501-508. Consequently, circulators or isolators can be avoided.

While the invention has been described above with reference to a 16-rung birdcage resonator it has to be noted that the invention is generally applicable to a birdcage resonator with any number of rungs, e.g. 24 or 32 rungs.

The invention claimed is:

1. A birdcage resonator for MR imaging, wherein the birdcage resonator surrounds an examination volume and comprises:
    N rungs arranged in parallel to a longitudinal axis of the examination volume, each rung comprising a rung capacitance, where N is a plural positive integer;
    two end rings arranged at the opposite ends of the rungs, each end ring comprising a plurality of ring capacitances, wherein each ring capacitance interconnects a pair of adjacent rungs, each pair of adjacent rungs and interconnecting ring capacitances forming a mesh of the birdcage resonator;
    wherein the ring capacitances and the rung capacitances are proportioned so that:
        the birdcage resonator has spatially independent N resonant modes that are tuned to a common resonance frequency, and
        the meshes of the birdcage resonator are not electrically decoupled from each other such that the birdcage resonator is not degenerate.

2. The birdcage resonator according to claim 1, wherein the N rungs are disposed circumferentially around a generally cylindrical shape.

3. The birdcage resonator according to claim 1, wherein a ratio of the ring capacitance ($C_{ring}$) to the rung capacitance ($C_{rung}$) is 0.89.

4. The birdcage resonator according to claim 3, wherein ring capacitance is 58.4 pF and the rung capacitance is 65.6 pF.

5. A birdcage resonator comprising:
    N rungs arranged parallel to a longitudinal axis of an examination volume and circumferentially around the examination volume, each rung including a rung capacitance and being electrically connected to one of N RF drive ports, where N is a plural positive integer;
    two end rings arranged at the opposite ends of the rungs, each end ring including a plurality of ring capacitances interconnecting pairs of adjacent rungs, each pair of adjacent rungs and interconnecting ring capacitances forming one of N individual meshes,
    wherein the ring capacitances and the rung capacitances are proportioned such that:
        the birdcage resonator has N resonant modes that are tuned to a given resonance frequency, and
        the N individual meshes of the birdcage resonator are not electrically decoupled to be independently driven at the given resonance frequency with a selectable driving magnitude and phase
    wherein the birdcage resonator is a non-degenerate birdcage resonator.

6. The birdcage resonator according to claim 5, wherein when an RF signal at the given resonance frequency supplied via only one of the RF drive ports generates an RF electrical current at the given resonance frequency in each of the rungs.

7. The birdcage resonator according to claim 6, wherein a magnitude of the RF current and a phase of the RF current in each rung is dependent on a spatial relation of each rung relative to the rung to which an RF signal is supplied.

8. An MR device including:
    a main magnet for generating a uniform, steady magnetic field within the examination volume along a main field axis,
    a number of gradient coils for generating switched magnetic field gradients in different spatial directions within the examination volume,
    the non-degenerate birdcage resonator according to claim 5,
    a control unit configured to coordinate supplying a temporal succession of RF pulses at the given resonance frequency via each of the N RF drive ports of the non-degenerate birdcage resonator and switching the magnetic field gradients, and
    a reconstruction processor.

9. The MR device according to claim 8, further comprising N RF transmitters, each RF transmitter being electrically connected to one of the N RF drive ports.

10. The MR device according to claim 9, further including N transmitters, each transmitter being connected to one of the N RF drive ports of the birdcage resonator.

11. The birdcage resonator according to claim 5, wherein 90° offset pairs of the drive ports are configured to be connected with a common transmitter.

12. An MR device comprising:
    a birdcage resonator which surrounds an examination volume, the birdcage resonator including:
        N rungs arranged parallel to a longitudinal axis of the examination volume, each rung including a rung capacitance, where N is a plural even integer,
        two ends rings arranged at the opposite ends of the rungs, each end ring including a plurality of ring capacitances, each ring capacitance interconnecting a pair of adjacent rungs, wherein each pair of adjacent rungs and interconnecting ring capacitances forms a mesh of the birdcage resonator,
        wherein the ring capacitances and the rung capacitances are proportioned such that:
            the birdcage resonator has N resonant modes that are tuned to a common resonance frequency, and
            the individual meshes of the birdcage resonator are electrically coupled to be independently driven at the common resonance frequency such that the birdcage resonator is not degenerate,
        N drive ports, each of the N drive ports being connected with a corresponding one of the N rungs;
        N/2 transmit channels, each transmit channel being connected to a quadrature pair of RF drive ports of the birdcage resonator via a quadrature hybrid.

13. The MR device according to claim 12, wherein each transmit channel comprises an RF power amplifier, a power of the RF signal transmitted via each transmit channel being individually adjustable for the purpose of RF shimming.

14. The MR device according to claim 12, wherein the rungs are arranged circumferentially around the examination region and to define a cylinder and each pair of drive ports are disposed 90° around the cylinder.

15. The MR device according to claim 12, further including:
    a main magnet configured to generate a steady magnetic field within the examination volume along the longitudinal axis;
    a plurality of gradient coils configured to generate switched magnetic field gradients in the examination volume;

a reconstruction processor configured to reconstruct magnetic resonance signals received from one of the birdcage resonator or an RF receive coil into a magnetic resonance image; and a display device configured to display the reconstructed magnetic resonance image.

16. The MR device according to claim 12, wherein when an RF signal at the given resonance frequency supplied via any one of the RF drive ports generates an RF electrical current at the given resonance frequency in each of the rungs.

* * * * *